United States Patent [19]

Eberbach

[11] 4,430,527
[45] Feb. 7, 1984

[54] LOUDSPEAKER CROSSOVER DELAY EQUALIZATION

[76] Inventor: Steven J. Eberbach, 950 Fountain St., Ann Arbor, Mich. 48103

[21] Appl. No.: 384,193

[22] Filed: Jun. 3, 1982

[51] Int. Cl.³ .............................................. H04R 3/00
[52] U.S. Cl. ................................... 381/97; 333/28 T; 381/98; 381/107
[58] Field of Search ............... 179/1 D, 1 J; 333/28 T

[56] References Cited

U.S. PATENT DOCUMENTS

| | | | |
|---|---|---|---|
| 4,109,107 | 8/1978 | Boast | 179/1 D |
| 4,130,726 | 12/1978 | Kates et al. | 179/1 D |
| 4,130,727 | 12/1978 | Kates | 179/1 D |
| 4,137,510 | 1/1979 | Iwahara | 179/1 D X |
| 4,315,102 | 2/1982 | Eberbach | 179/1 D |
| 4,333,063 | 6/1982 | Ryu et al. | |
| 4,340,778 | 7/1982 | Cowans et al. | 179/1 D |

FOREIGN PATENT DOCUMENTS 55-124393   9/1980   Japan ................................... 179/1 J

*Primary Examiner*—G. Z. Rubinson
*Assistant Examiner*—Keith E. George
*Attorney, Agent, or Firm*—James M. Deimen

[57] ABSTRACT

Electric circuitry to correct for spurious sound pressure responses of audio transducers is disclosed. In particular, electric circuitry to compensate for "pre-shoot" of an audio transducer system is disclosed. The circuitry includes a delay line electric circuit carrying the bulk of the electric signal energy to the audio transducers and a parallel circuit to feed forward in real time an electric signal replica of diminished amplitude to the audio transducers. The replica thereby cancels or greatly minimizes the "pre-shoot" or prior undesired significant sound pressure responses of the audio transducers. The circuits include, in combination with the feed forward circuit, additional circuitry to counteract subsequent undesired significant sound pressure amplitude responses such as resonance (ringing). The new circuits utilize series resonant circuits in parallel to ground with the audio transducers as the preferred means to counteract the subsequent undesired sound pressure responses.

18 Claims, 10 Drawing Figures

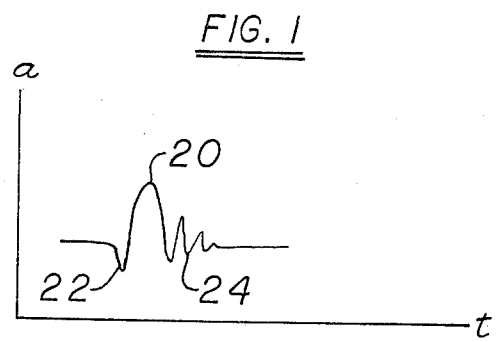//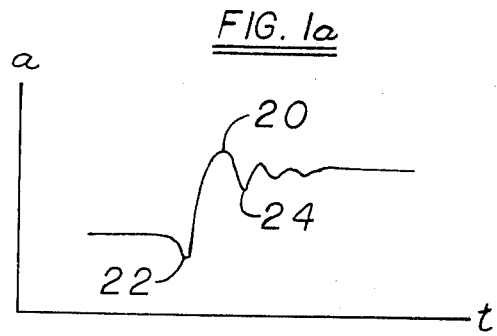
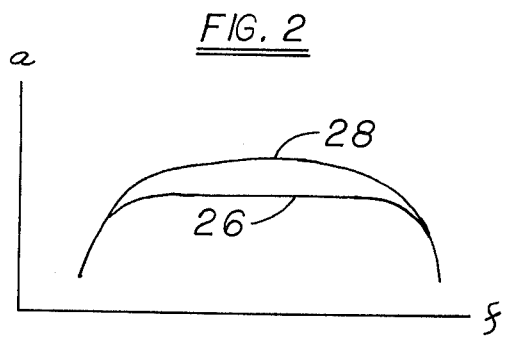//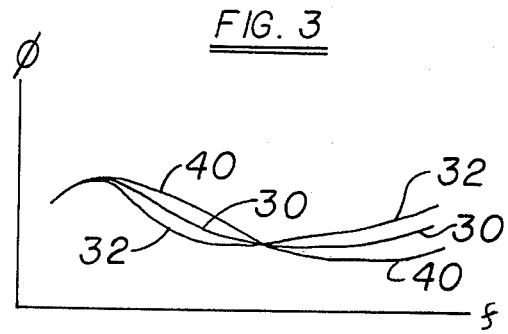
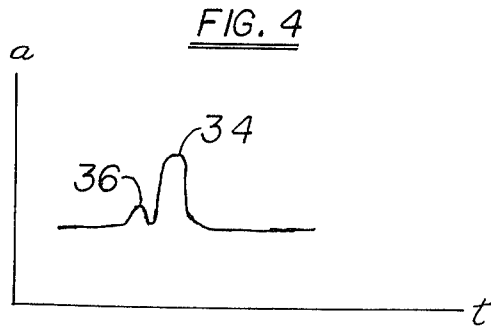//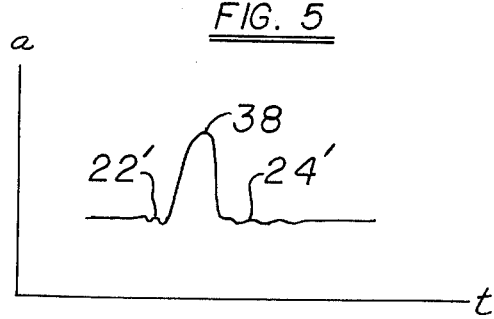
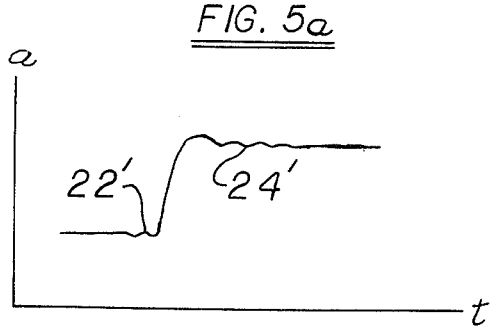

LOUDSPEAKER CROSSOVER DELAY EQUALIZATION

BACKGROUND OF THE INVENTION

The field of the invention pertains to audio reproduction loudspeakers. In particular, the invention pertains to electric crossover circuitry connected to and in combination with multiple audio transducers primarily for use in loudspeakers although not exclusively limited thereto.

The response of an electro-magnetically powered audio transducer to an electric input signal, whether complex or simple in waveform, is a complex phenomenon. Assuming the maximum time domain sound pressure amplitude response to be the desired response to an impulse input waveform, step input waveform or sinusoidal waveform, a plurality of prior and subsequent sound pressure responses of lesser amplitude will emanate from the audio transducer. Such prior and subsequent sound pressure responses are spurious and if of sufficient amplitude can significantly affect the perceived sound. "Ringing" of the audio transducer is one well known example of a subsequent spurious sound pressure amplitude response.

U.S. Pat. No. 4,130,727 to Kates discloses a means for deriving a delayed signal from the input signal to a filter and audio transducer. The delayed signal is summed with the input signal to create a modified drive signal for the audio transducer. The delayed signal is manipulated to provide input resonances complementary to the subsequent spurious sound pressure response resonances of the audio transducer thereby minimizing or cancelling the effect of the subsequent spurious sound pressure responses.

Kates discloses a plurality of active components with digital sampling techniques and mentions the possibility of using passive delay means in substitution for his active components but does not disclose a suitable passive circuit. Such a passive circuit, if realizeable for the Kates application, would likely be prohibitively expensive.

Spurious sound pressure responses prior to the desired maximum sound pressure response are essentially aperiodic in both the time and frequency domains and may be of an amplitude sufficient to be significant. The above noted means for controlling subsequent response resonances, however, do not include means for controlling non-resonant prior spurious responses such as "pre-shoot".

SUMMARY OF THE INVENTION

The invention comprises electric circuit means in combination with an audio transducer and its frequency dividing filter to minimize or cancel "pre-shoot" or prior spurious sound pressure amplitude responses in the time domain. Thus, it is an object of the invention to correct time domain errors in the sound pressure amplitude response of an audio transducer before the bulk or maximum sound pressure amplitude response occurs. The invention requires only a small number of additional passive components and therefore is cost effective although digital or active filter means could be applied.

To provide a corrective signal to the audio transducer prior to the maximum amplitude signal, the bulk of the electric input to the filter for the audio transducer is passed through a delay line. In parallel with at least a portion of the delay line is a feed forward circuit of greater impedance than the delay line providing a gain factor less than one. A replica signal of lesser amplitude is thereby fed into the audio transducer prior to the maximum amplitude signal and bulk of the electrical energy.

Typically, the "pre-shoot" or prior significant sound pressure amplitude response of an audio transducer is of opposite sense from the desired sound pressure amplitude response and is essentially aperiodic in form. The equalization, comprising an earlier in time replica of the input signal fed into the audio transducer, is used to achieve a more accurate time domain response as well as to adjust the overall response in the frequency domain.

The delay circuit and feed forward circuit are combined with one or more series resonant circuits in parallel to ground with the audio transducer. In the combination, the series resonant circuits are adjusted to lessen or cancel the subsequent significant sound pressure amplitude response resonances or ringing whereby prior and subsequent spurious significant sound pressure amplitude responses are nullified or diminished.

The invention may be applied to the "pre-shoot" of the time domain response of a group of audio transducers by feeding the replica signal in advance to one or more of the audio transducers in the group such that the amplitude response of the combination of audio transducers is an accurate replica of the input signal.

Although specifically directed to audio transducers, the feed forward circuit is useful where the bulk of the energy transfer in a system of multiple parallel energy transfer paths, passes through one of the slower paths. The signal passed and processed by the feed forward circuit can then be used to affect leading phenomena in a transducer or other element fed by the multiple path circuit.

Since the bulk of the input electrical signal energy passes through the delay line or network, the noise or distortion level of the circuit is dependent upon the signal to noise quality of the delay line. Delay network components must be of a superior quality to be used in audiophile quality loudspeakers. Superior quality delay networks for audiophile loudspeakers are disclosed in applicant's pending application Ser. No. 146,254 wherein the method of adjustment results in an audiophile quality delay network with a superior signal to noise ratio compared to present digital or bucket brigade delay networks.

Applicant has discovered from the testing of actual loudspeakers embodying the feed forward circuit or bypass in parallel with at least a portion of the delay line, that the perceived sound from the loudspeaker is improved more dramatically than expected from past experience. The dramatic improvement is perceived by demanding listeners when the overall signal to noise ratio and accuracy of adjustment of the delay line is superior. Otherwise the dramatic effect is masked by the delay line ripple or poor signal to noise ratio of a less than superior quality delay line.

DESCRIPTION OF THE DRAWING

FIGS. 1 and 1a illustrate the time domain acoustic pressure impulse and step response curves respectively of an approximately phase coherent loudspeaker without the feed forward circuit;

FIG. 2 illustrates the frequency domain acoustic amplitude response of a high frequency transducer and its associated filter with and without equalization;

FIG. 3 illustrates the frequency domain acoustic phase response of a high frequency transducer and its associated band pass filter with and without equalization;

FIG. 4 illustrates the impulse response of the modified band pass filter and delay circuit;

FIGS. 5 and 5a illustrate the time domain acoustic pressure response to an impulse or step input respectively of a phase coherent loudspeaker including the feed forward circuit;

DESCRIPTION OF THE PREFERRED EMBODIMENTS

Figure 6:
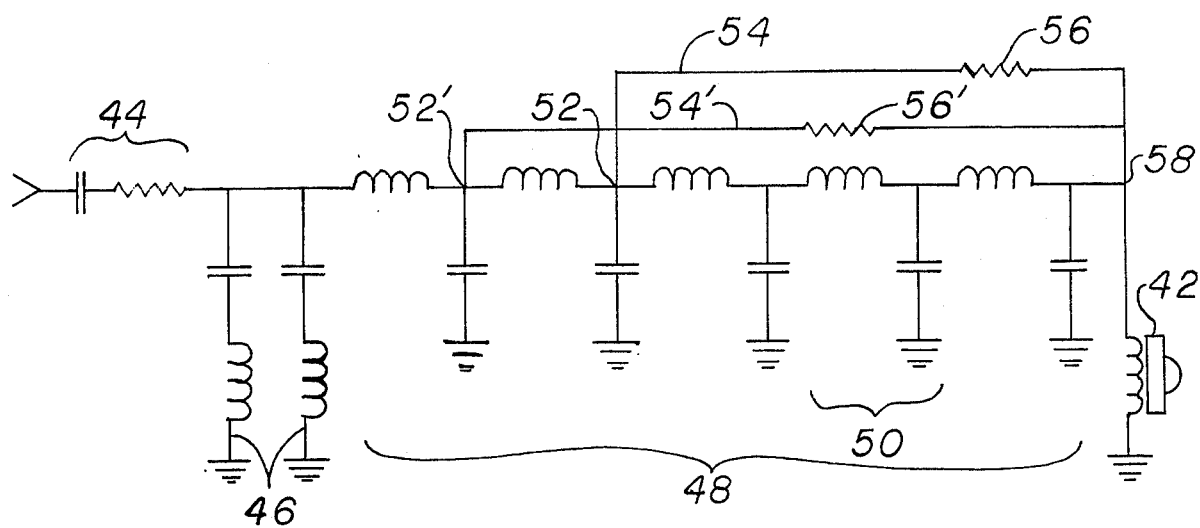
FIG. 6 is a schematic of a high frequency filter and audio transducer network incorporating a tapped network with a feed forward bypass circuit.

FIGS. 1 and 1a illustrate the time domain amplitude response to an impulse input signal or step input signal, respectfully, of an approximately phase coherent loudspeaker adjusted in accordance with the teaching of applicant's pending application above and issued U.S. Pat. No. 4,315,102. The high peak 20 represents the maximum energy transfer through the transducer and is the desired maximum sound pressure amplitude response. Spurious significant sound pressure amplitude responses occur both prior to 22 and subsequent to 24 the desired maximum 20 and are believed caused by complex phenomena such as traveling waves in a paper loudspeaker cone. The subsequent spurious amplitude responses are usually viewed as resonances or ringing of the transducers and loudspeaker.

Prior art approaches to equalization of amplitude frequency response result in a leveling of the amplitude response in the frequency domain as illustrated in FIG. 2 by line 26 in comparison with the unequalized response 28. However, in the phase frequency domain the delayed replicas of the input signal undesirably reduce the "flatness" of the phase frequency curve over the middle frequency range as illustrated in FIG. 3. Unequalized, the relationship is represented by curve 30 and equalized by curve 32.

Applicant's approach is to apply a leading replica of the input signal to compensate or equalize the prior spurious amplitude response of the transducer in the time domain. FIG. 4 illustrates the modified impulse signal applied to the transducer to counter the leading spurious amplitude response. Peak 34 denotes the maximum energy transfer or amplitude signal desired and peak 36 denotes the leading replica of signal 34. The replica is of lesser amplitude than peak 34 and opposite in sense to the spurious sound pressure amplitude 22 in FIG. 1. In combination with one or more series resonant shunts across the transducer to compensate for the remaining subsequent spurious pressure spurious responses, the response of the transducer in the time domain can be made to approach that illustrated by the curve in FIG. 5 with minimum spurious peaks 22' and 24' and desired peak 38. The response to a step input is illustrated in FIG. 5a.

Applicant's approach retains the desired flattening of the amplitude frequency curve in the frequency domain illustrated in FIG. 2, however, more importantly, the phase frequency curve in the frequency domain is flattened as shown at 40. The time dispersion as perceived by the listener is reduced with improved sound quality to the listener.

To accomplish applicant's approach requires that the input electric signal be sensed and a portion fed in real time to a summing junction ahead of the majority of the energy of the input signal to the summing junction. This may be accomplished by passing the bulk of the input signal through a delay line and a small portion through one or more high impedance circuits bypassing at least a portion of the delay line. Such a circuit for a high frequency transducer 42 is illustrated in FIG. 6. The circuit includes filter 44, series resonant circuit means 46 and a delay line generally denoted by 48 comprising a plurality of delay segments 50. Tapped into an intermediate junction 52 of the delay line 48 is a bypass feed forward circuit 54 including a resistor 56. The bypass circuit 54 terminates at a summing junction 58 with the end of the delay line 48. The bypass feed forward resistor 56 resistance is substantially larger than the characteristic impedance of the delay line or network in parallel with the bypass circuit 54.

Applicant's approach is not limited to a single feed forward bypass circuit. Multiple feed forward circuits can be added as illustrated by circuit 54' with resistor 56' and a tap into the delay line at 52'. Each bypass is of a resistance or impedance greater than that of the delay line or network in parallel therewith.

Figure 7:
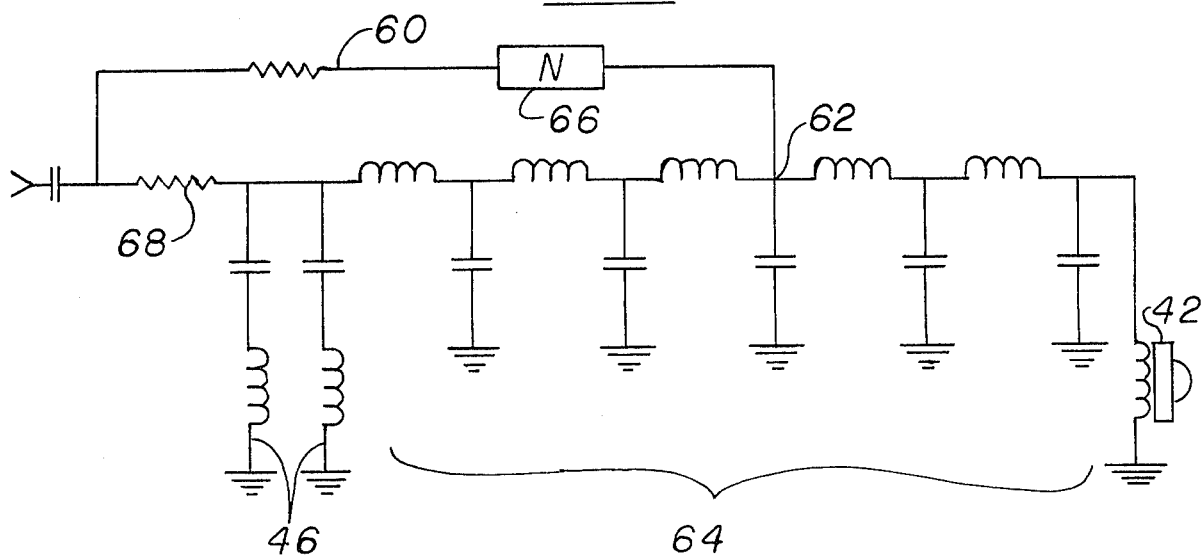
FIG. 7 is a schematic of a high frequency filter and audio transducer network incorporating a different form of bypass feed forward circuit; and, FIG. 8 is a schematic of a loudspeaker crossover network incorporating a high frequency band pass filter, delay line and bypass circuit.

Alternatively, the bypass feed forward circuit can be constructed as shown in FIG. 7 wherein the bypass 60 is summed 62 into an intermediate stage of the delay line 64. FIG. 7 illustrates two optional features that may be incorporated into the circuit. The bypass 60 can include a filter network 66 selected to limit the frequency range for which the bypass circuit provides a replica signal. The delay of the filter network 66 must be limited to less than the overall delay of the delay line in parallel therewith for the frequency selective compensation of prior spurious response to be effective. Thus, the replica signal can be limited to those frequencies for which the audio transducer prior spurious response is significant. Secondly, the bypass feed forward circuit can also be taken from any location in the filter. For example, the bypass may begin just ahead of the filter resistor 68 as shown. This example has the advantage of allowing a greater impedance of the bypass and less undesirable loading of the delay line 64.

Figure 8:
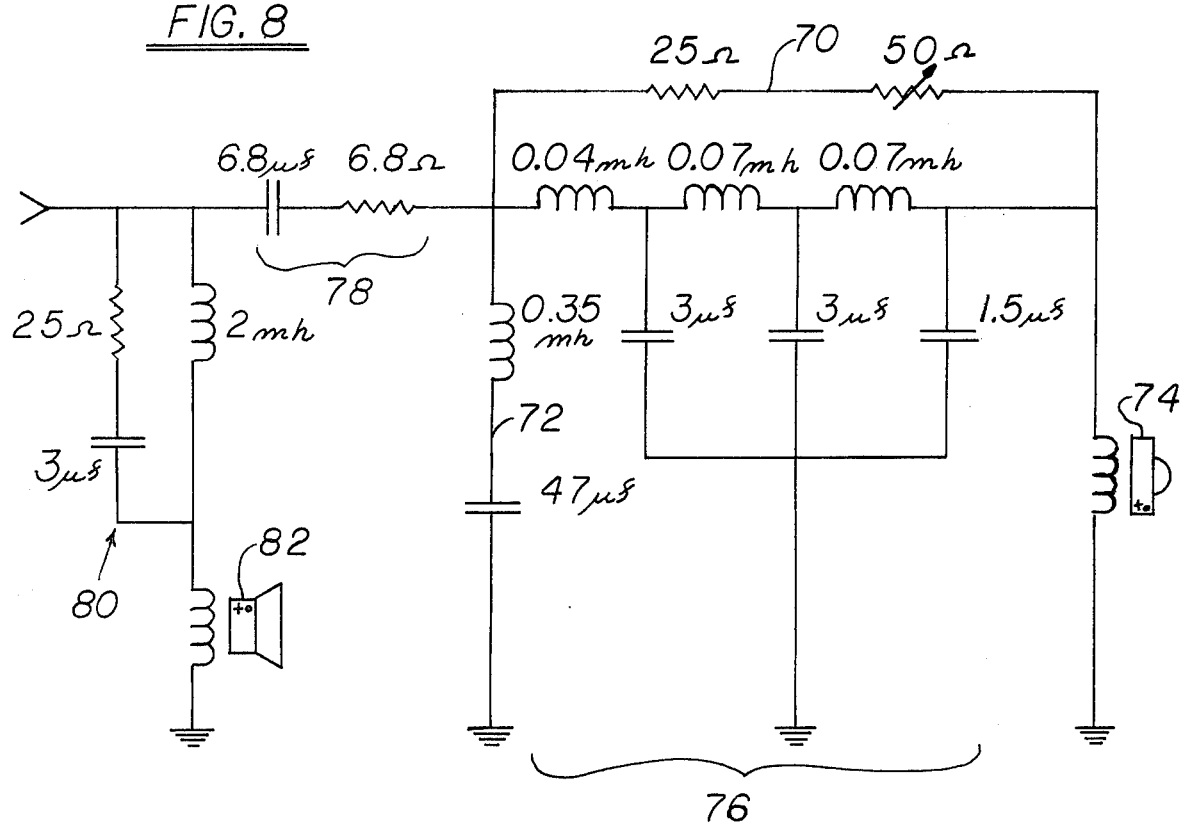

FIG. 8 illustrates a crossover and audio transducer network developed for a small bookshelf loudspeaker that incorporates a feed forward circuit 70 and delay line 76 in parallel. To control and minimize spurious subsequent high frequency audio transducer 74 responses a series resonant circuit 72 parallel to the transducer 74 is connected between the filter 78 and the delay line 76. The low frequency filter 80 and low frequency audio transducer 82 are shown to the left of the high frequency filter 78.

In the circuit of FIG. 8 one series resonant shunt 72 is used. The series resonant shunt 72 is adjusted for minimum ringing and minimum subsequent spurious response of the audio transducer 74 and entire circuit combination including the low frequency filter 80 and audio transducer 82 as distinguished from impedance matching with the transducer. Typically, the most effective minimum impedance value of the series resonant shunt 72 is less than half that of the transducer 74.

In accordance with the methods disclosed in applicant's pending application and patent referred to above, the entire loudspeaker is first adjusted for flattest phase response in both high frequency and low frequency pass bands and through the crossover frequency. For the circuit of FIG. 8, the capacitive branch of the low frequency filter 80 and the series resonant circuit 72 are adjusted with the feed forward bypass 70 open (inoperative). Completion of this adjustment produces a partially adjusted phase coherent loudspeaker with performance characteristics as illustrated in FIGS. 1 and 1a.

The testing procedure is repeated with the bypass 70 closed. Further adjustment of the capacitive branch of the low frequency filter 80 and series resonant circuit 72 for flattest phase response of the loudspeaker through both pass bands and the crossover frequency produces the time domain responses illustrated in FIGS. 5 and 5a. The result is substantial elimination of the "pre-shoot" 22 down to 22' and further reduction of subsequent spurious responses 24 down to 24'. The above adjustment method is repeated as necessary. From experience applicant has found the time required to optimize the loudspeaker performance is substantially reduced over that required to optimize filter and delay crossovers in loudspeakers without the bypass.

The superior response is best accomplished with the polarities of the low frequency 82 and high frequency 74 transducers reversed with respect to each other. In the circuit of FIG. 8 the low frequency transducer is a Heppner Model No. 4846-SD and the high frequency transducer is a Philips Model No. AD-0140-TE. The circuit of FIG. 8 is, however, not limited to the above transducers nor is the method limited to any particular transducers. The bypass provides a circuit that is much more forgiving of transducer imperfections and peculiarities. The bypass permits economically practical mass production of reasonably priced superior performance loudspeakers because less demand is placed upon transducer performance and the bypass circuit above is relatively inexpensive to manufacture.

I claim:

1. In an audio reproduction system comprising audio transducer means and electric circuit means drivingly connected to said audio transducer means, said audio reproduction system having a substantially smooth amplitude frequency response characteristic and a time domain sound pressure amplitude response having at least one significant amplitude component less than and occurring before the maximum amplitude response of the transducer means to an input signal to the system, the improvement characterized by means in the electric circuit means to combine said input signal and at least one earlier replica of said input signal, said earlier replica of less amplitude than said input signal and including a component corresponding to said significant amplitude component and opposite in sense.

2. The audio reproduction system of claim 1 wherein the component of said earlier replica is substantially equal in amplitude to said significant amplitude component.

3. The audio reproduction system of claim 1 wherein the audio transducer means include a plurality of transducers and the electric circuit means includes means to combine said input signal and at least one earlier replica of said input signal, said combined signal being transmitted to one of said transducers.

4. The audio reproduction system of claim 1 including a plurality of audio transducers and means in said electric circuit means to combine said input signal and at least one earlier replica of said input signal, said combined signal being transmitted to one or more of said plurality of audio transducers.

5. The audio reproduction system of claim 1 including frequency selective means in the electric circuit means to limit the generation of said earlier replica to a selected frequency range.

6. An electric drive circuit for connection to audio transducer means, said audio transducer means time domain amplitude response having at least one significant amplitude component occurring before the maximum amplitude response of the audio transducer means to an input signal, the improvement characterized by electric means in said electric drive circuit to provide a time domain amplitude response component smaller in amplitude and occurring prior to the maximum amplitude response of the drive circuit to the input signal, said smaller amplitude response component substantially equal in amplitude and opposite in sense to said significant amplitude component of said transducer means, whereby substantial equalization of the leading time domain component of said audio transducer means is achieved.

7. The electric drive circuit of claim 6 including a delay line and a bypass circuit in parallel with at least a portion of said delay line, the impedance of the bypass circuit being substantially greater than the characteristic impedance of the delay line.

8. The electric drive circuit of claim 7 wherein the bypass circuit is frequency selective to limit amplitude and phase equalization to a selected frequency range.

9. The electric drive circuit of claim 7 wherein the bypass circuit is substantially resistive.

10. The electric drive circuit of claim 7 wherein the bypass circuit is substantially capacitive.

11. The electric drive circuit of claim 7 wherein the bypass circuit is in parallel with the entire delay line, the bypass circuit signal and delay line signal being summed at the output of the delay line.

12. The electric drive circuit of claim 7 wherein the bypass circuit signal is summed with the delay line signal intermediate the ends of the delay line.

13. The electric drive circuit of claim 7 wherein the bypass circuit is tapped into an intermediate stage of the delay line and is summed with the delay line signal at the output of the delay line.

14. The electric drive circuit of claim 7 wherein the bypass circuit is tapped ahead of a resistance in series with the delay line.

15. The electric drive circuit of claim 6 including a delay line and a bypass circuit in parallel with at least a portion of said delay line, the gain of said bypass circuit being less than unity.

16. The electric drive circuit of claim 6 including at least one series resonant shunt in parallel to ground with the input of said electric drive circuit.

17. In an audio reproduction system comprising electro-mechanical transducer means and electric circuit means drivingly connected to said transducer means and, wherein a significant energy transfer through the reproduction system occurs prior to the maximum energy transfer through the reproduction system in the time domain in response to an input signal to the electric circuit means thereby causing frequency time dispersion error in the acoustic output signal, the improvement characterized by a passive electric delay circuit and a bypass circuit in parallel with at least a portion of said delay circuit, the energy transfer through the entire delay circuit being substantially greater than the energy transfer through the bypass circuit in response to the input signal to the system and, the energy transfer through the entire delay circuit arriving at the transducer means subsequent to the energy transfer through said bypass circuit in response to the input signal to the system.

18. The audio reproduction system of claim 17 wherein the bypass circuit is frequency selective to limit amplitude and phase equalization to a selected frequency range.

* * * * *

UNITED STATES PATENT AND TRADEMARK OFFICE
CERTIFICATE OF CORRECTION

PATENT NO. : 4,430,527
DATED : February 7, 1984
INVENTOR(S) : Steven J. Eberbach It is certified that error appears in the above-identified patent and that said Letters Patent are hereby corrected as shown below:

Col. 3, line 63: Delete "spurious" second occurrence after the word pressure.

Signed and Sealed this

First Day of May 1984

[SEAL]

Attest:

Attesting Officer

GERALD J. MOSSINGHOFF
Commissioner of Patents and Trademarks